(12) United States Patent
Dang et al.

(10) Patent No.: US 7,045,867 B2
(45) Date of Patent: May 16, 2006

(54) SEMICONDUCTOR DEVICE OF REDUCED GATE OVERLAP CAPACITANCE AND METHOD OF MANUFACTURING THE SEMICONDUCTOR DEVICE

(75) Inventors: Hai Dang, Tokyo (JP); Shigenobu Maeda, Tokyo (JP); Takuji Matsumoto, Tokyo (JP); Yuuichi Hirano, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 68 days.

(21) Appl. No.: 10/456,548

(22) Filed: Jun. 9, 2003

(65) Prior Publication Data

US 2004/0051151 A1 Mar. 18, 2004

(30) Foreign Application Priority Data

Sep. 18, 2002 (JP) ......................... 2002-271389

(51) Int. Cl.
*H01L 29/76* (2006.01)

(52) U.S. Cl. ......................... 257/408; 257/412; 257/288
(58) Field of Classification Search ................ 257/288, 257/344, 408, 412
See application file for complete search history.

(56) References Cited

U.S. PATENT DOCUMENTS 6,136,657 A * 10/2000 Yang et al. ................. 438/303

| 6,248,638 | B1 | 6/2001 | Havemann |
| 6,507,073 | B1 | 1/2003 | Hishinuma |
| 6,661,066 | B1 | 12/2003 | Kuroi et al. |
| 6,674,137 | B1 * | 1/2004 | Nissa ......................... 257/408 |
| 2002/0132431 | A1 * | 9/2002 | Fung et al. ................. 438/300 |

FOREIGN PATENT DOCUMENTS

| JP | 5-129595 | 5/1993 |
| JP | 7-335875 | 12/1995 |
| JP | 8-78684 | 3/1996 |
| JP | 2000-138183 | 5/2000 |
| JP | 2001-168328 | 6/2001 |
| JP | 2002-164537 | 6/2002 |
| TW | 483167 | 4/2002 |

* cited by examiner

*Primary Examiner*—Brad Smith
(74) *Attorney, Agent, or Firm*—Oblon, Spivak, McClelland, Maier & Neustadt, P.C.

(57) ABSTRACT

Provided is an MOS transistor capable of reducing gate overlap capacitance without decreasing the driving current of the MOS transistor. Specifically, a double-angle smile oxidation structure is obtainable by curving the side surface of a gate electrode (22) so as to widen upwardly, and thickening the edge portion of a gate oxide film (21) by re-oxidation. The impurity concentration of a source/drain layer under the double-angle smile oxidation structure (a region around point B) is set to the range of $4 \times 10^{18}$ $cm^{-3} \pm 40\%$.

9 Claims, 18 Drawing Sheets

SEMICONDUCTOR DEVICE OF REDUCED GATE OVERLAP CAPACITANCE AND METHOD OF MANUFACTURING THE SEMICONDUCTOR DEVICE

BACKGROUND OF THE INVENTION

1. Field of the Invention

The present invention relates to a semiconductor device and its manufacturing method. In particular, the present invention relates to a semiconductor device of reduced gate overlap capacitance and a method of manufacturing the semiconductor device.

2. Description of the Background Art

As the channel length of an MOS transistor is decreased with increasing the integration degree of semiconductor integrated circuits, it is increasingly difficult to reduce a gate overlap length in proportion to a gate length. As the result, the rate of gate overlap capacitance to intrinsic gate capacitance is greatly increased.

A reduction in parasitic capacitance, especially gate overlap capacitance, is the key to achieve high-speed operation of transistors at low power supply voltages.

As a technique of reducing gate overlap capacitance, there is one in which an already formed gate oxide film is further oxidized to increase the thickness of its edge portion. This technique is hereinafter referred to as "smile oxidation" (see for example the 22nd column and FIG. 9 in Japanese Patent Application Laid-Open No. 8-78684).

Specifically, the above-mentioned publication discloses the technique that with a gate electrode formed on a gate oxide film, thermal oxidation in a dry oxygen atmosphere containing neither vapor nor hydrogen is performed such that both ends of the gate oxide film is sharply thickened, thereby reducing gate overlap capacitance.

There is also other technique that with a gate electrode of polycrystal silicon (polysilicon) formed on a gate oxide film, thermal oxidation is performed to increase both ends of a gate oxide film at the same time that a thermal oxide film is formed on the surface of the gate electrode, although there is no description of a reduction in gate overlap capacitance (see for example the 16th column and FIG. 9 in Japanese Patent Application Laid-Open No. 7-335875, the fourth column and FIG. 2 in Japanese Patent Application Laid-Open No. 5-129595, and the fourth and fifth columns and FIG. 1D in Japanese Patent Application Laid-Open No. 2000-138183).

However, a reduction in gate overlap capacitance cannot be achieved only by increasing both ends of a gate oxide film and even a problem such as reduction in driving current may occur.

SUMMARY OF THE INVENTION

It is an object of the present invention to provide an MOS transistor capable of reducing gate overlap capacitance without decreasing the driving current of the MOS transistor.

According to a first aspect of the semiconductor device of the present invention, a semiconductor device includes an MOS transistor having a semiconductor substrate, a gate insulating film selectively disposed on the semiconductor substrate, a gate electrode selectively disposed on the gate insulating film, and a spacer insulating film disposed on the side surface of the gate electrode. The gate insulating film includes a first part corresponding to the central portion of a lower part of the gate electrode and a second part corresponding to the edge portion of the lower part of the gate electrode. The second part has a contoured shape widening vertically so as to increase its thickness from a portion for engagement with the first part. A contoured shape in the state that the spacer insulating film engages the second part of the gate insulating film is in a continuous form of at least an inclination having a first angle corresponding to a tilt angle of a side lower part of the gate electrode and an inclination having a second angle with respect to a main surface of the semiconductor substrate on the upper side of the second part of the gate insulating film. The first angle is greater than the second angle.

By the use of the structure having the contoured shape that the second part of the gate insulating film widens vertically so as to increase its thickness from a portion for engagement with the first part, gate overlap capacitance can further be reduced as the length of the second part is increased. In addition, gate resistance can be lowered because the upper main surface of the gate electrode is wider than the lower main surface.

According to a second aspect of the semiconductor device of the present invention, a semiconductor device includes an MOS transistor having a semiconductor substrate, a gate insulating film selectively disposed on the semiconductor substrate, a gate electrode selectively disposed on the gate insulating film, and a spacer insulating film disposed on the side surface of the gate electrode. The gate insulating film includes a first part corresponding to the central portion of a lower part of the gate electrode and a second part corresponding to the edge portion of the lower part of the gate electrode. The second part has a contoured shape widening upwardly so as to increase its thickness from a portion for engagement with the first part and also curving so as to project outwardly.

Gate overlap capacitance can be reduced by the presence of the structure that the second part of the gate insulating film widens upwardly so as to increase its thickness from a portion for engagement with the first part.

According to an aspect of the method of manufacturing a semiconductor device of the present invention includes the following steps of (a) to (d). The step (a) is to successively form an insulating film and conductive film on a semiconductor substrate. The step (b) is to selectively form a gate electrode on the insulating film by patterning the conductive film. The step (c) is to perform thermal oxidation to the entire surface of the semiconductor substrate so that the insulating film immediately below the gate electrode is changed to a gate insulating film, thereby forming a gate electrode structure that the gate insulting film and the gate electrode are stacked on the semiconductor substrate, and also forming around the gate electrode structure a first silicon oxide film that engages the gate insulating film and is thicker than the gate insulating film. The step (d) is, after forming a second silicon oxide film so as to cover the gate electrode structure and the first silicon oxide film, to perform anisotropic etching in order that the second silicon oxide film on the gate electrode and on the first silicon oxide film is removed to form a spacer insulating film on the side surface of the gate electrode, and in order that the first silicon oxide film not covered with the gate electrode and the spacer insulting film is removed to form such a structure that a portion of the first silicon oxide film is left in the state of engagement with the edge portion of the gate insulating film.

The MOS transistor of reduced gate overlap capacitance is obtainable by configuring the structure that a portion of the first silicon oxide film thicker than the gate insulating film is left in the state of engagement with the edge of the gate insulating film. Further, in the step (d), the spacer insulating film is formed on the side surface of the gate electrode by removing the second silicon oxide film on the gate electrode and on the first silicon oxide film by anisotropic etching. It is therefore possible to set separately the length of the first silicon oxide film left in engagement with the gate insulating film and the width of the spacer insulating film used as an offset spacer. This increases the degree of freedom for setting the length of the first silicon oxide film contributing to a reduction in gate overlap capacitance and the width of the offset spacer, thus facilitating formation of MOS transistors to meet the user's demand.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment
<A-1. Manufacturing Method>

First, a method of manufacturing an MOS transistor 100 according to a first preferred embodiment of the present invention will be described with reference to FIGS. 1 to 7, sequentially showing its manufacturing steps. The configuration of the MOS transistor 100 is plotted in FIG. 7 showing the final step.

Figure 1:
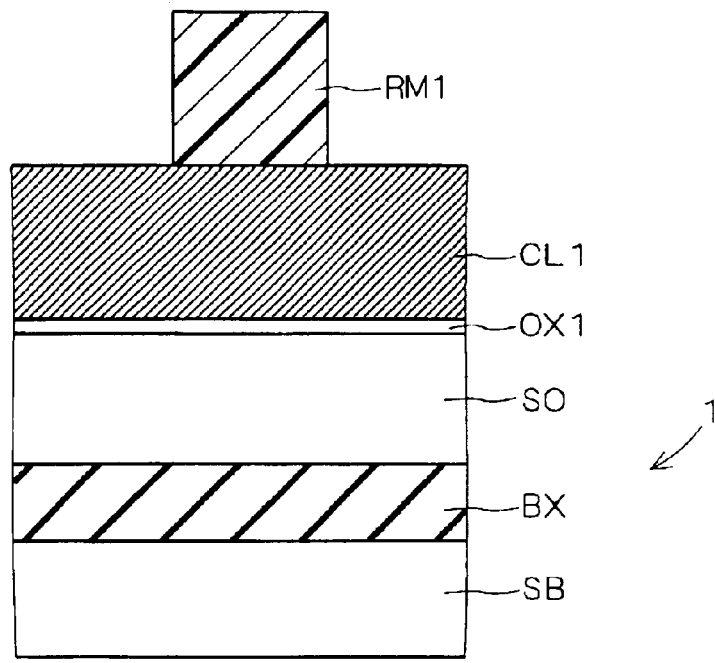
FIGS. 1 to 7 are sectional views to explain manufacturing steps of a semiconductor device according to a first preferred embodiment of the invention.

Referring now to FIG. 1, an SOI substrate 1 configured by a silicon substrate SB, buried oxide film BX, and SOI layer SO is prepared. Then, a silicon oxide film OX1 having a thickness of 1 to 4 nm is formed on the entire surface of a main surface of the SOI layer SO, by for example thermal oxidation, radical oxidation, radical nitriding method or a combination of these. The silicon oxide film OX1 will be used later as a gate oxide film (gate insulating film). Instead of the silicon oxide film, a silicon nitride film may be used to form the gate insulating film.

Thereafter, a conductive film CL1 having a thickness of 50 to 200 nm is formed on the silicon oxide film OX1. The conductive film CL1 is formed for example by a polysilicon film, and it will be used later as a gate electrode.

On the conductive film CL1, a resist mask RM1 is patterned to define a region for leaving the conductive film CL1 and silicon oxide film OX1.

Figure 2:
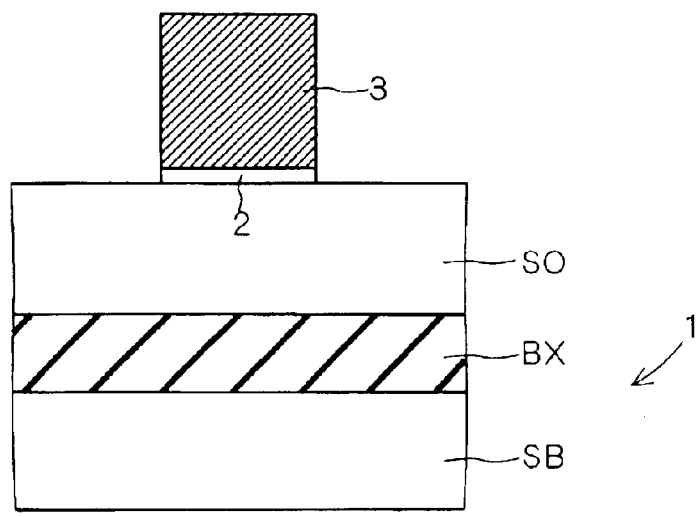

Subsequently, the conductive film CL1 not covered with the resist mask RM1 is removed by anisotropic etching, thus obtaining such a configuration that a gate electrode 3 is selectively formed on the silicon oxide film OX1, as shown in FIG. 2.

Figure 3:
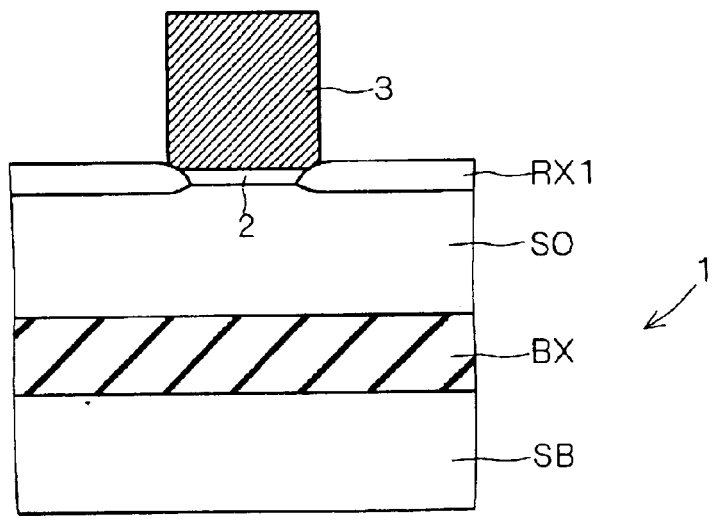

In the step shown in FIG. 3, oxidation under temperature conditions of 700 to 1100° C. is performed to form a re-oxide film RX1 (a first silicon oxide film) on the surface of the SOI layer SO that is not covered with the gate electrode 3, and on the surface of the gate electrode 3. After passing through this step, the silicon oxide film OX1 underlying the gate electrode 3 becomes a gate oxide film 2, thereby obtaining a gate electrode structure that the gate electrode 3 is stacked on the gate oxide film 2. The re-oxide film RX1 thicker than the gate oxide film 2 is formed on the SOI layer SO. At this time, the re-oxide film RX1 extends in the shape of bird's beak and engages the edge portion of the gate oxide film 2 below the gate electrode 3, thereby thickening the edge portion of the gate oxide film 2. Such a structure is hereinafter referred to as a "smile oxidation structure (or gate edge re-oxidation structure)."

When employing the smile oxidation structure, it is desirable to optimize the impurity concentration of a source/drain layer of an MOS transistor in order to achieve high-speed operation of the MOS transistor. That is, to achieve the high-speed operation of the MOS transistor, it is necessary to reduce gate overlap capacitance without decreasing driving current. The present inventors have come to the conclusion that the impurity concentration of the source/drain layer below the smile oxidation structure, namely in a region around point A shown in FIG. 5, is preferably in the range of $1 \times 10^{19}$ cm$^{-3}$±40% (from $6 \times 10^{18}$ cm$^{-3}$ to $1.4 \times 10^{19}$ cm$^{-3}$).

Figure 4:
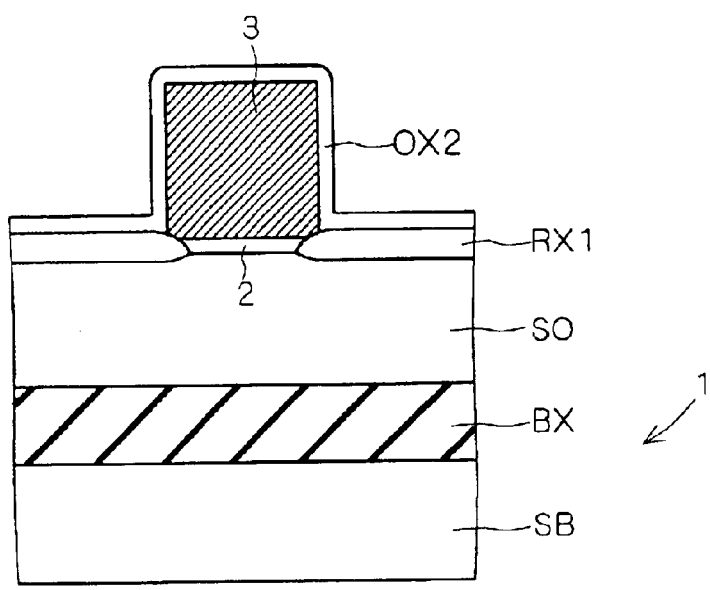

In the step shown in FIG. 4, a high-temperature oxide film (HTO film) OX2 (a second silicon oxide film) having a thickness of 5 to 25 nm is deposited on the entire surface of the SOI substrate 1, by using high-temperature CVD (chemical vapor deposition) method in a SiH$_4$ and N$_2$O gas or NO gas atmosphere and under the temperature conditions of 700 to 900° C.

Figure 5:
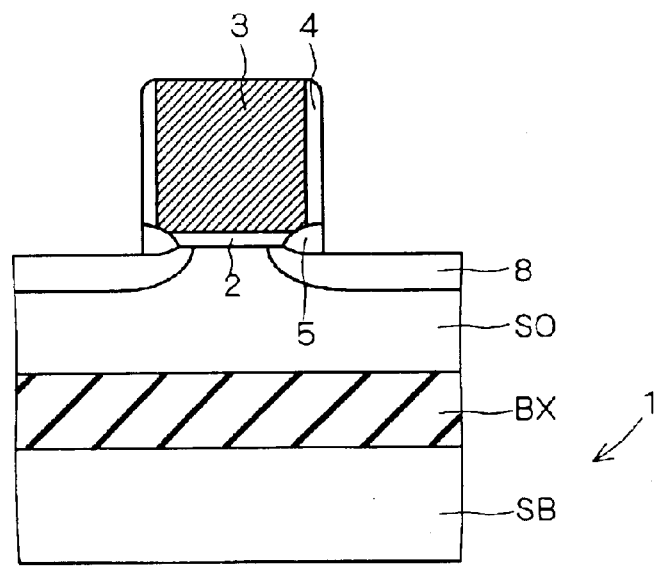

In the step shown in FIG. 5, the HTO film OX2 and re-oxide film RX1 on the upper surface of the gate electrode 3 are removed and the re-oxide film RX1 on the SOI layer SO is removed by anisotropic dry etching, so that an offset spacer 4 is formed on the side surface of the gate electrode 3. At this time, a portion of the re-oxide film RX1 which is engaged with the edge portion of the gate oxide film 2 (a first part of the gate insulating film) is covered with the gate electrode 3 and offset spacer 4. Therefore, this portion remains without removing and configures a smile oxide film 5 (a second part of the gate insulating film).

After forming the offset spacer 4, ion implantation of impurity is performed to form a source/drain extension layer 8. At this time, as described previously, the impurity concentration of the source/drain extension layer 8 around point A (a region immediately below the edge portion of the smile oxide film 5) in FIG. 5 is set to the range of $1 \times 10^{19}$ cm$^{-3}$±40%.

The source/drain extension layer 8 is an impurity layer that is formed so as to have a shallower junction than a source/drain layer to be formed later and that has the same conductivity type and functions as the source/drain layer.

Figure 6:
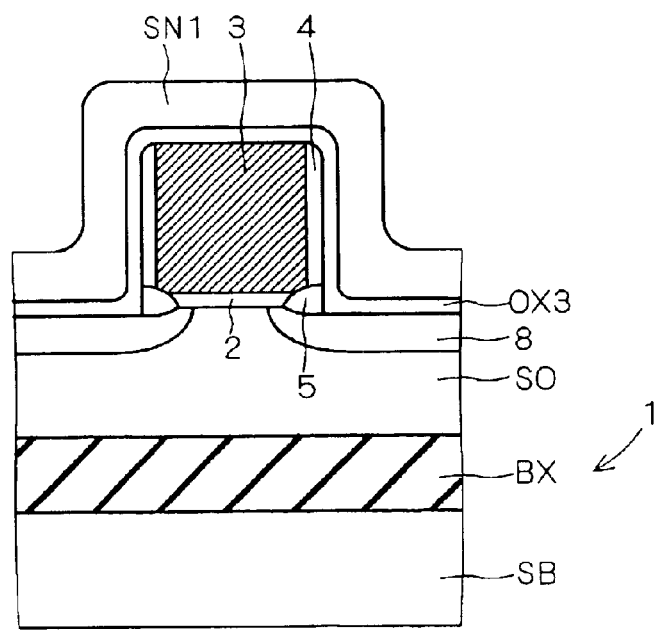
Figure 7:
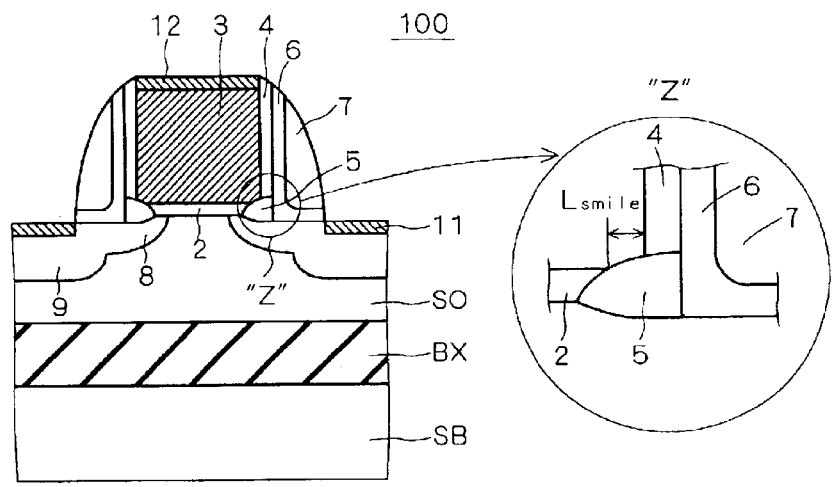

In the step shown in FIG. 6, a TEOS (tetra ethyl orthosilicate) oxide film OX3 having a thickness of 5 to 25 mn is deposited over the entire surface of the SOI substrate 1 by plasma CVD method. Subsequently, a silicon nitride film SN1 having a thickness of 20 to 70 nm is deposited on the TEOS oxide film OX3 by low pressure CVD method or plasma CVD method.

In the step shown in FIG. 7, an anisotropic dry etching is performed to remove the TEOS oxide film OX3 and silicon nitride film SN1 on the upper surface of the gate electrode 3, thereby obtaining such a configuration that has a first gate sidewall 6 located externally of the offset spacer 4 and a second gate sidewall 7 located externally of the first gate sidewall 6.

Subsequently, a source/drain layer 9 is formed by ion implantation of impurity by using as mask the gate electrode 3, re-oxide film RX1, offset spacer 4, and first and second gate sidewalls 6 and 7.

Thereafter, silicide films 11 and 12 composed of $CoSi_2$ or $TiSi_2$ are formed on the upper surfaces of the source/drain layer 9 and gate electrode 3, resulting in the MOS transistor 100. The silicide films 11 and 12 are not essential components.

FIG. 7 is accompanied with an enlarged view of region Z around the smile oxide film 5, wherein Lsmile denotes the length of the smile oxide film 5. That is, the length of the smile oxide film 5, Lsmile, is to be defined by the length from the inner side surface of the offset spacer 4 to a portion for engagement with the gate oxide film 2.

An optimum value of the length of the smile oxide film 5 will be described by referring to FIG. 8, on which the abscissa represents the length of the smile oxide film 5, Lsmile, and the ordinate represents driving current Id ($\mu A/\mu m$) and gate overlap capacitance Cov ($fF/\mu m$) of the MOS transistor.

Figure 8:
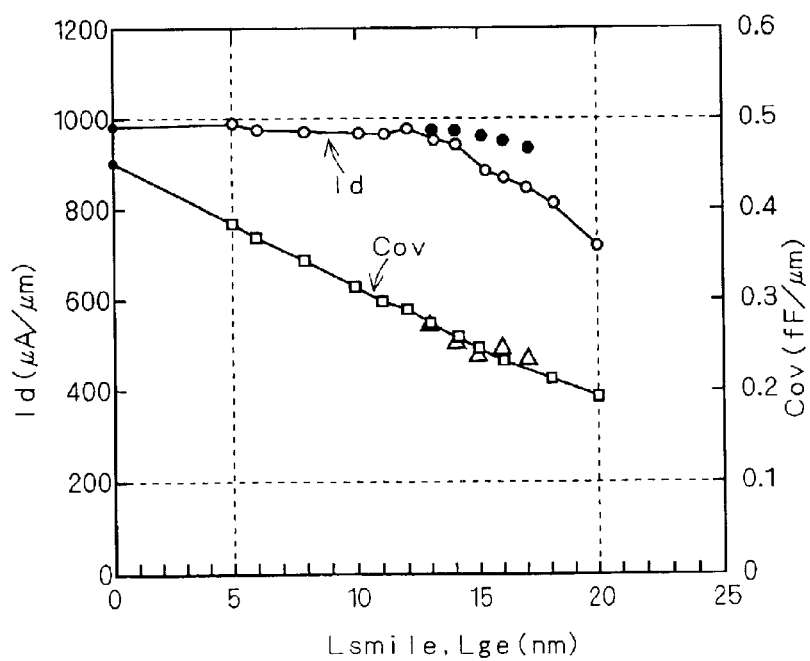
FIG. 8 is a diagram of characteristics to explain an optimum value of the length of a smile oxide film.

In FIG. 8, the symbol "○" represents driving current variations when Lsmile is changed, and the symbol "□" represents gate overlap capacitance variations when Lsmile is changed.

As seen from FIG. 8, as the length of the smile oxide film 5, Lsmile, is increased, the gate overlap capacitance Cov decreases and driving current Id first maintains constant and then lowers. Since the driving current Id begins to decrease when Lsmile is over 12 nm, it is desirable that the length of the smile oxide film 5, Lsmile, is about 12 nm at the most.

Data given in FIG. 8 are obtained when the source/drain layer underlying the smile oxidation structure, i.e., the source/drain extension layer 8, has an impurity concentration of $1 \times 10^{19}$ $cm^{-3}$.

<A-2. Operation and Effect>

As described above, the MOS transistor 100 of the first preferred embodiment employs the smile oxidation structure that the edge portion of the gate oxide film 2 is thickened by smile oxidation. Gate overlap capacitance can be reduced without decreasing driving current by setting the impurity concentration of the source/drain layer underlying the smile oxidation structure, i.e., the region around point A shown in FIG. 5, to the range of $1 \times 10^{19}$ $cm^{-3} \pm 40\%$.

Further, gate overlap capacitance can be reduced without decreasing driving current by setting the length of the smile oxide film 5, Lsmile, to about 12 nm at the most.

According to the manufacturing method of the first preferred embodiment, after forming the re-oxide film RX1 in the step shown in FIG. 3, the high temperature oxide film OX2 is formed so as to cover the gate electrode 3 by high-temperature CVD method in the step shown in FIG. 4, and the high temperature oxide film OX2 is left only on the side surface of the gate electrode 3 in order to form the offset spacer 4 in the step shown in FIG. 5. Therefore, the length of the smile oxide film 5 and the width of the offset spacer 4 can be set separately, thereby increasing the degree of freedom for setting the length of the smile oxide film 5 and the width of the offset spacer 4. This is advantageous for obtaining the structure that gate overlap capacitance is reduced without decreasing driving current. In addition, it is easy to make MOS transistors to meet the user's demand.

Although the foregoing description is made of the example of forming the MOS transistor 100 on the SOI substrate, it may be formed on a bulk silicon substrate.

B. Second Preferred Embodiment

The first preferred embodiment is directed to the example that the impurity concentration of the source/drain layer underlying the smile oxidation structure is optimized in order to reduce gate overlap capacitance without decreasing driving current. It is possible to further reduce gate overlap capacitance without decreasing driving current by employing such a double-angle smile oxidation structure that a smile oxide film is of two-stage taper shape.

Following is a manufacturing method and structure of an MOS transistor 200 having the double-angle smile oxidation structure, as a second preferred embodiment of the present invention.

<B-1. Manufacturing Method>

The method of manufacturing the MOS transistor 200 will be described with reference to FIGS. 8 to 20, sequentially showing its manufacturing steps. The configuration of the MOS transistor 200 is plotted in FIG. 20 showing the final step.

Figure 9:
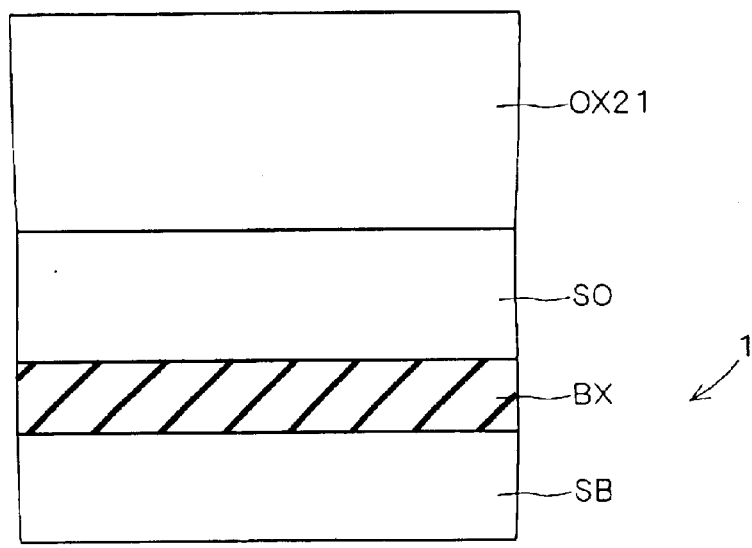
FIGS. 9 to 20 are sectional views to explain the manufacturing steps of a semiconductor device according to a second preferred embodiment of the invention.

Referring now to FIG. 9, an SOI substrate 1 configured by a silicon substrate SB, buried oxide film BX, and SOI layer SO is prepared. Then, a silicon oxide film OX21 having a thickness of 50 to 300 nm is formed on the entire surface of a main surface of the SOI layer SO.

Figure 10:
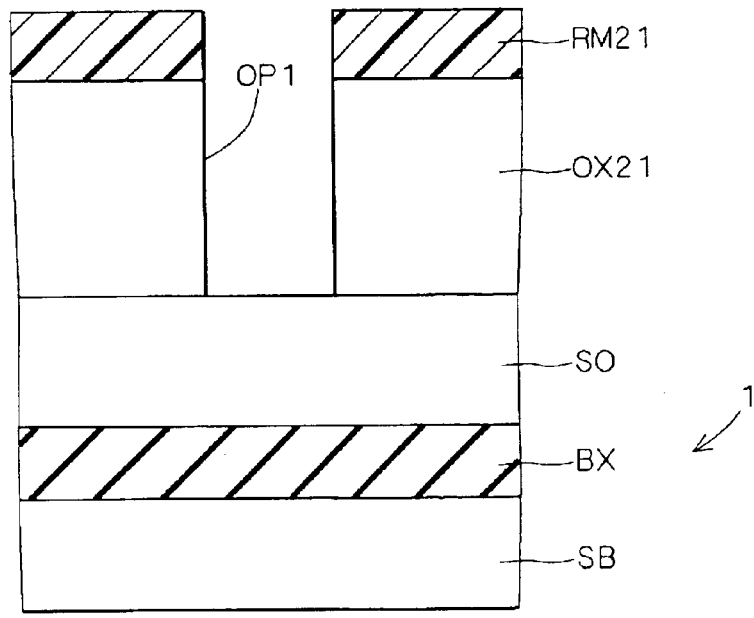

In the step shown in FIG. 10, a resist mask RM21 is patterned on the silicon oxide film OX21. Then, by anisotropic dry etching using the resist mask RM21 as an etching mask, the silicon oxide film OX21 is removed to form an opening OP1 that reaches the SOI layer SO.

The resist mask RM21 is then removed. In the step shown in FIG. 11, a resist mask RM22 is patterned on the silicon oxide film OX21. This patterning is performed such that an opening OP3 of the resist mask RM22 is overlapped with the opening OP1 disposed in the silicon oxide film OX21, and such that the opening OP3 is larger than the opening OP1.

Subsequently, the silicon oxide film OX21 surrounding the opening OP1, which is not covered with the resist mask RM22, is removed by anisotropic dry etching using the resist mask RM22 as an etching mask. As the result, there is formed an opening OP2, the inner wall of which is curved so as to increase its opening area as it is vertically away from the SOI layer SO.

Figure 11:
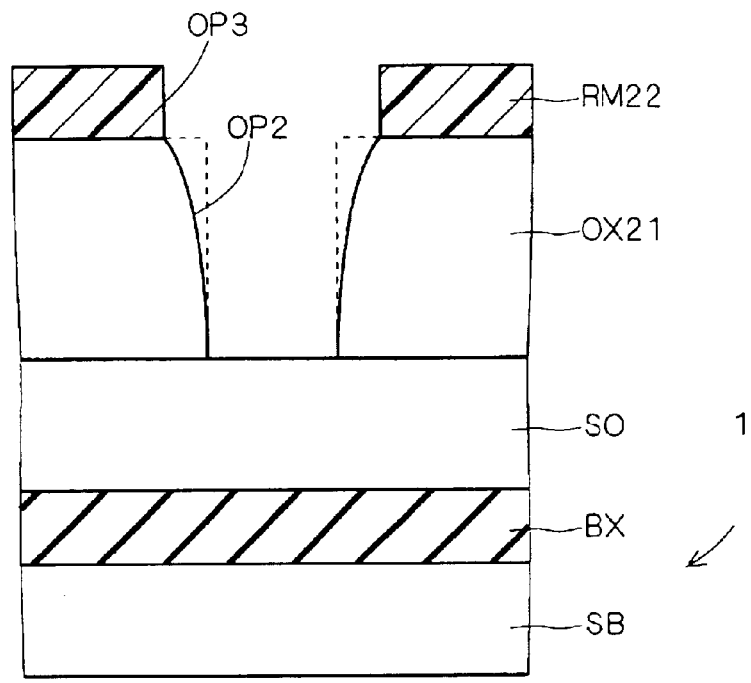
Figure 12:
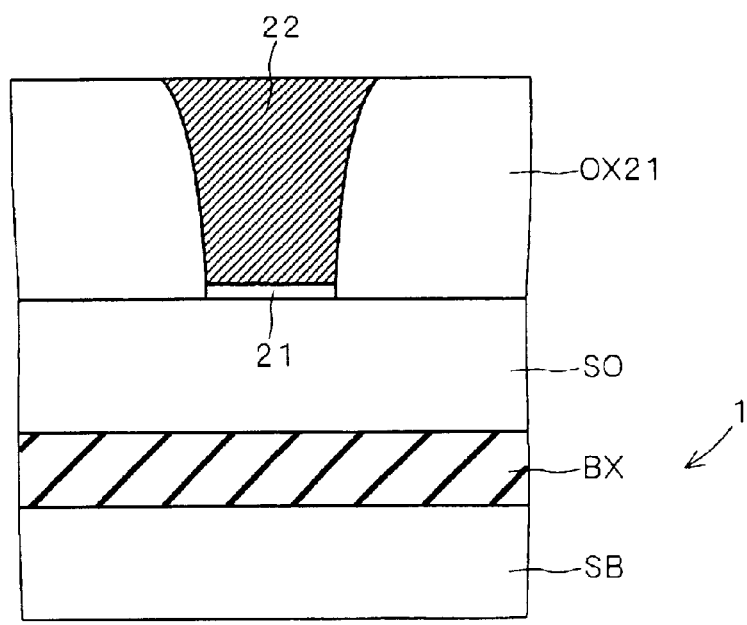

Specifically, the opening OP2 is obtainable by setting the etching conditions such that the etching rate of dry etching for forming the opening OP2 is smaller than that for forming the opening OP1, and stopping the etching at the time that the curved inner wall as shown in FIG. 11 is obtained by removing more amount of the upper part of the inner wall than the lower part.

In an alternative, after the opening OP1 is formed by using the resist mask RM21, an opening corresponding to the opening OP3 of the resist mask is made by widening the opening of the resist mask RM21 by ashing (etching) process, and the opening OP2 is formed by using the after-ashing (etching) resist mask RM21 instead of the resist mask RM22. This method produces the effect that the after-ashing (etching) resist mask RM21 can be formed in a self-alignment manner.

The resist mask RM22 is then removed. In the step shown in FIG. 12, a gate oxide film OX21 having a thickness of 1 to 4 nm is formed on the SOI layer SO that is exposed to the bottom part of the opening OP2, by for example thermal oxidation, radical oxidation, radical nitriding method or a combination of these. Instead of the silicon oxide film, a silicon nitride film may be used to form the gate insulating film.

Subsequently, a gate electrode 22 is obtained by filling the opening OP2 with a conductive film such as polysilicon film.

Figure 13:
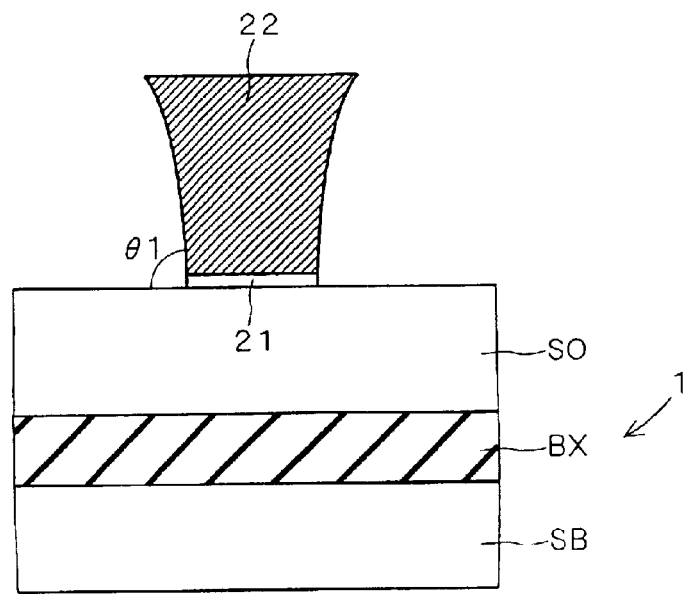

In the step shown in FIG. 13, the silicon oxide film OX21 is removed to obtain a gate structure that the gate oxide film 21 and gate electrode 22 are stacked on the SOI substrate 1. The side surface of the gate electrode 22 is curved so as to widen upwardly such that the upper main surface of the gate electrode 22 is wider than the lower main surface. In this curve, the angle of inclination on the lower side is hereinafter referred to as a "large angle θ1 (a first angle)."

Figure 14:
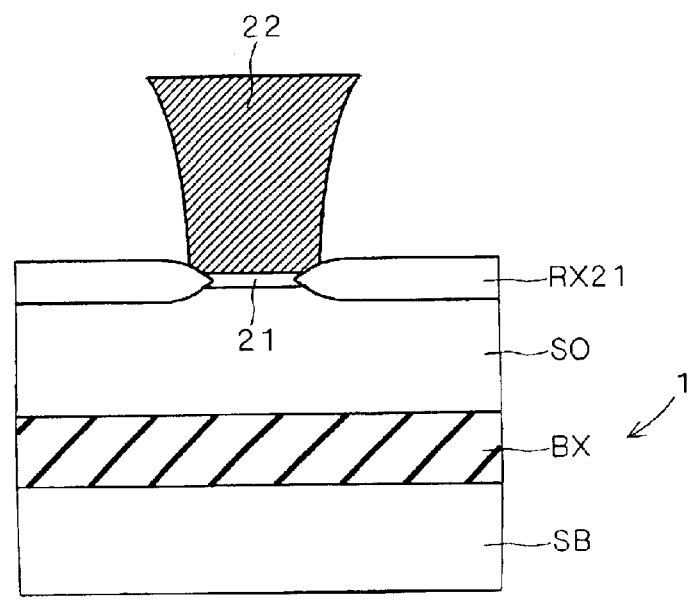

In the step shown in FIG. 14, a re-oxide film RX21 is formed on the surface of the exposed surface of the SOI layer SO and on the surface of the gate electrode 22 by performing oxidation under temperature conditions of 700 to 1100° C. The re-oxide film RX21 on the SOI layer SO is formed so as to be thicker than the gate oxide film 21. At this time, the re-oxide film RX21 extends in bird's beak shape and engages the edge portion of the gate oxide film 21 underlying the gate electrode 22. As the result, the edge portion of the gate oxide film 21 becomes thick, resulting in the smile oxidation structure.

Figure 15:
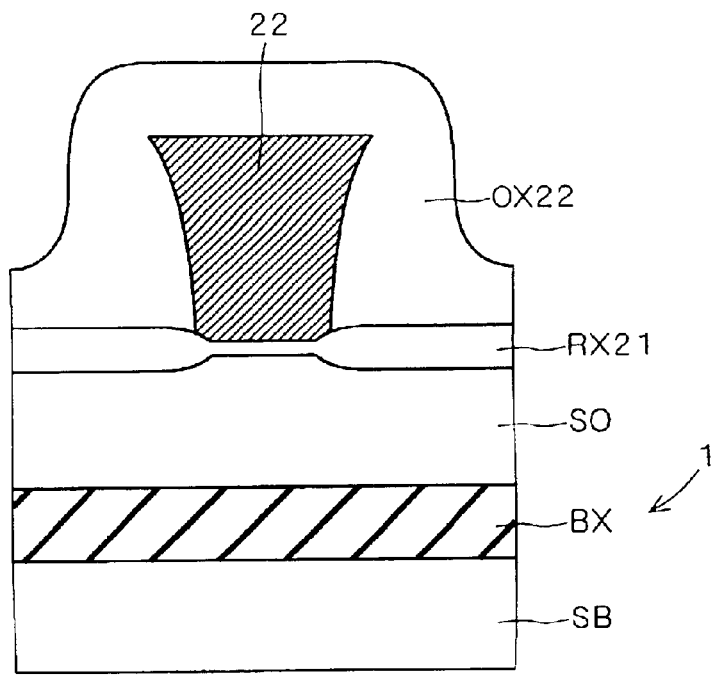

In the step shown in FIG. 15, a HTO film OX22 having a thickness of 5 to 25 nm is deposited on the side surface and upper surface of the gate electrode 22 by using high-temperature CVD method in a $SiH_4$ and $N_2O$ gas or NO gas atmosphere and under the temperature conditions of 700 to 900° C. The HTO film OX22 is also formed on the re-oxide film RX1.

Figure 16:
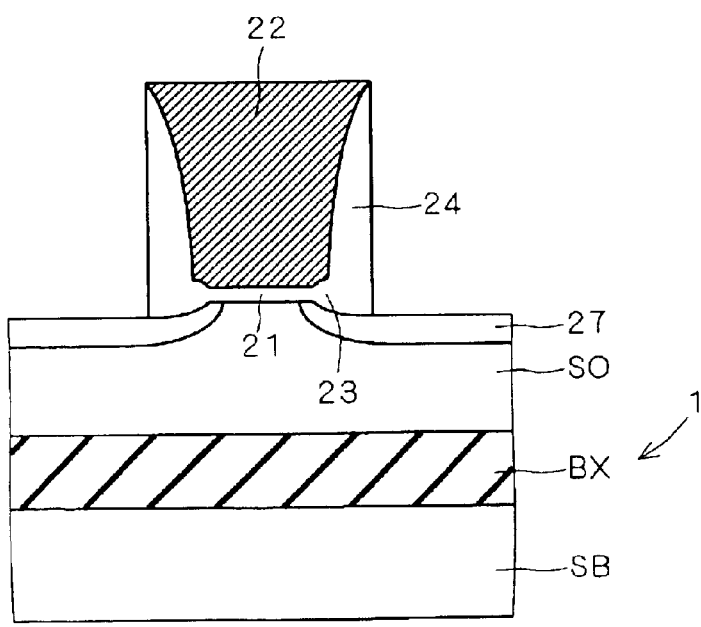

In the step shown in FIG. 16, the HTO film OX22 and re-oxide film RX21 on the upper surface of the gate electrode 22 and the re-oxide film RX21 on the SOI layer SO are removed by anisotropic dry etching, so that an offset spacer 24 is formed on the side surface of the gate electrode 22. A portion of the re-oxide film RX21 which has extended into the underside of the gate oxide film 22 is covered with the gate electrode 22 and offset spacer 24. Therefore, this portion remains without removing and configures a smile oxide film 23 (a second part of the gate insulating film) that has such a contour shape widening vertically so as to increase its thickness from a portion for engagement with the gate insulating film 21.

Figure 17:
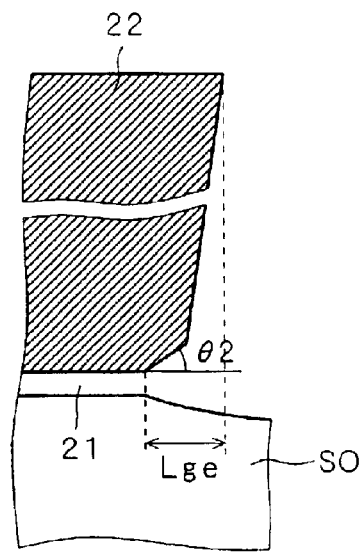

FIG. 17 shows details of the vicinity of the edge portion of the gate oxide film 21 (the first part of the gate insulating film). In FIG. 17, there is depicted only the contours of the smile oxide film 23 and offset spacer 24, wherein a small angle θ2 (a second angle) denotes the tilt angle of the upper side of the smile oxide film 23 in the vicinity of the engagement between the smile oxide film 23 and gate oxide film 21.

The tilt angle of the lower side on the side surface of the curved gate electrode 22 is defined as the large angle θ1 (see FIG. 13). In the state that the offset spacer 24 is engaged with the smile oxide film 23, it can be considered that the smile oxide film 23 is of two-stage taper shape to be formed by continuing two types of tapers: one having the large angle θ1; and the other having the small angle θ2. This is the double-angle smile oxidation structure. Hereinafter, the smile oxide film 23 is referred to as a "double-angle smile oxide film 23."

Referring again to FIG. 17, the character "Lge" denotes the length of the double-angle smile oxide film 23. That is, the length of the double-angle smile oxide film 23, Lge, is defined by the length from the position at which the uppermost edge of the side surface of the gate electrode 22 is vertically projected to the portion for engagement with the gate oxide film 21.

After forming the offset spacer 24, ion implantation of impurity is performed to form a source/drain extension layer 27. At this time, in the MOS transistor 100 of the foregoing first preferred embodiment, the impurity concentration of the source/drain extension layer 8 around point A shown in FIG. 5 is preferably set to the range of $1\times10^{19}$ $cm^{-3}\pm40\%$ in order that gate overlap capacitance is reduced without decreasing driving current. On the other hand, in the MOS transistor 200 having the double-angle smile oxide film 23, the present inventors have come to the conclusion that the impurity concentration of the source/drain extension layer 27 around point B shown in FIG. 20 (the region immediately below the edge portion of the smile oxide film 23) is preferably set to the range of $4\times10^{18}$ $cm^{-3}\pm40\%$ (from $2.4\times10^{18}$ $cm^{-3}$ to $5.6\times10^{18}$ $cm^{31\ 3}$).

The present inventors have also found the fact that the optimum range of the large angle θ1 is 86°±5%, and the optimum range of the small angle θ1 is 10°±70% (3° to 17°).

Figure 18:
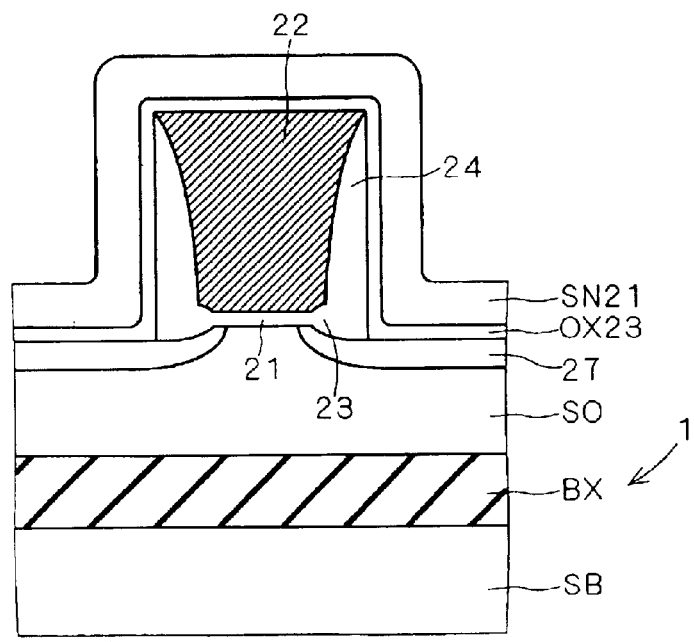

In the step shown in FIG. 18, a TEOS oxide film OX23 having a thickness of 5 to 25 nm is deposited over the entire surface of the SOI substrate 1 by plasma CVD method. Subsequently, a silicon nitride film SN21 having a thickness of 20 to 70 nm is deposited on the TEOS oxide film OX23 by low pressure CVD method or plasma CVD method.

Figure 19:
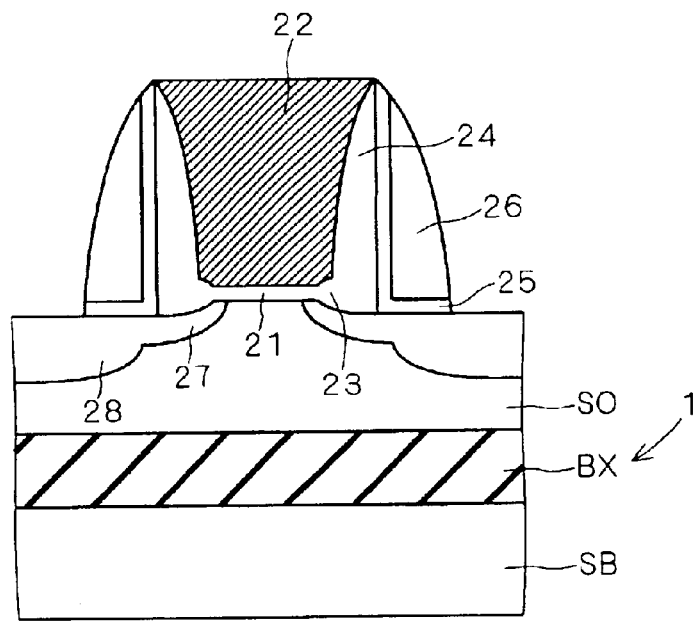
Figure 20:
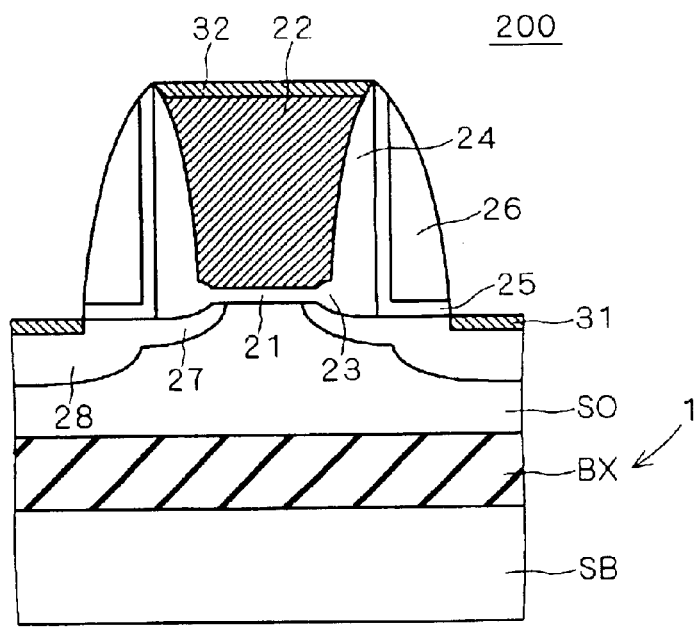

In the step shown in FIG. 19, the TEOS oxide film OX23 and silicon nitride film SN21 on the upper surface of the gate electrode 22 are removed by anisotropic dry etching, thereby obtaining such a configuration that has a first gate sidewall 25 located externally of the offset spacer 24 and a second gate sidewall 26 located externally of the first gate sidewall 25.

Subsequently, a source/drain layer 28 is formed by performing ion implantation of impurity by using as mask the gate electrode 22, offset spacer 24, and first and second gate sidewalls 25 and 26.

In the last step shown in FIG. 20, silicide films 31 and 32 composed of $CoSi_2$ or $TiSi_2$ are formed on the upper surfaces of the source/drain layer 28 and gate electrode 22, thereby obtaining the MOS transistor 200. The silicide films 31 and 32 are not essential components.

An optimum value of the length of the double-angle smile oxide film will be described by referring to FIG. 8. FIG. 8 also plots the characteristics of driving current Id of the MOS transistor and gate overlap capacitance Cov when changing the length of the double-angle smile oxide film 23, Lge, in addition to the characteristics when changing the length of the smile oxide film 5, as described in connection with FIG. 7.

In FIG. 8, the symbol "●" represents driving current variations when Lge is changed, and the symbol "Δ" represent gate overlap capacitance variations when Lge is changed.

As seen from FIG. 8, the gate overlap capacitance Cov decreases with increasing the length of the double-angle smile oxide film 23, Lge. Since the small angle θ2 is small, a large number of carriers occur by gate field (accumulate effect) in the region near point B shown in FIG. 20, so that driving current Id hardly lowers. This is apparent from a comparison with the characteristics when changing the length of the smile oxide film 5.

Hence, it can be seen that a greater Lge of the double-angle smile oxide film 23 further decreases gate overlap capacitance Cov, and the double-angle smile oxidation structure is more suitable for reducing gate overlap capacitance.

Data of the double-angle smile oxidation structure given in FIG. 8 are obtained when the source/drain layer underlying the double-angle smile oxidation structure, i.e., the source/drain extension layer 27 around point B shown in FIG. 20, has an impurity concentration of $4\times10^{18}$ cm$^{-3}$.

<B-2. Operation and Effect>

As described above, in the MOS transistor 200 of the second preferred embodiment, the double-angle smile oxidation structure is obtained by configuring such that the side surface of the gate electrode 22 is curved so as to widen upwardly, and by thickening the edge portion of the gate oxide film 21 by smile oxidation. With this configuration, gate overlap capacitance can be reduced without decreasing driving current, by setting the impurity concentration of the source/drain layer underlying the smile oxidation structure, i.e., the source/drain layer around point B shown in FIG. 20, to the range of $4\times10^{18}$ cm$^{-3}$±40%.

Since the restriction to the length of the double-angle smile oxide film 23, Lge, is relaxed, a greater length Lge further reduces gate overlap capacitance.

Further, since the side surface of the gate electrode 22 is curved so as to widen upwardly, the upper surface of the gate electrode 22 has a greater area than the lower surface, thus producing the effect of reducing gate resistance.

According to the manufacturing method of the second preferred embodiment, after forming the gate electrode 22, the side surface of which is curved so as to widen upwardly, the re-oxide film RX21 is formed in the step shown in FIG. 14, and the high-temperature oxide film OX22 is formed so as to cover the gate electrode 22 in the step shown in FIG. 15, and thereafter, the offset spacer 24 is formed by leaving the high-temperature oxide film OX22 only on the side surface of the gate electrode 22 in the step shown in FIG. 16. Therefore, the two stage tapers of the double-angle smile oxide film 23 can be formed independently. This increases the degree of freedom for setting the angles of the two stage tapers and thus facilitates formation of MOS transistors to meet the user's demand.

In addition, the presence of the offset spacer 24 increases effective channel length, thereby reducing parasitic bipolar effect. Therefore, body resistance can be lowered in the case of body fixing where the potential of the SOI layer is fixed.

Although the foregoing description is made of the example that the MOS transistor 200 is formed on the SOI substrate, it may be formed on a bulk silicon substrate.

C. Third Preferred Embodiment

The first preferred embodiment is directed to the smile oxidation structure when the gate electrode is formed by polysilicon. The smile oxidation structure is also applicable to the case that a gate electrode is formed by metal.

Following is a manufacturing method and structure of an MOS transistor 300 that has a metal gate electrode and employs the smile oxidation structure, as a third preferred embodiment of the present invention.

<C-1. Manufacturing Method>

The method of manufacturing the MOS transistor 300 will be described with reference to FIGS. 21 to 30, sequentially showing its manufacturing steps. The configuration of the MOS transistor 300 is plotted in FIG. 30 showing the final step.

Figure 21:
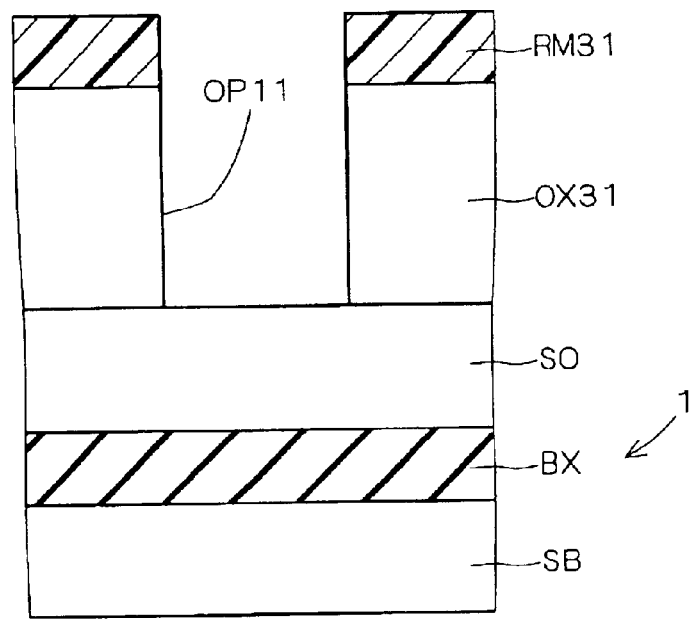
FIGS. 21 to 30 are sectional views to explain the manufacturing steps of a semiconductor device according to a third preferred embodiment of the invention.
Figure 22:
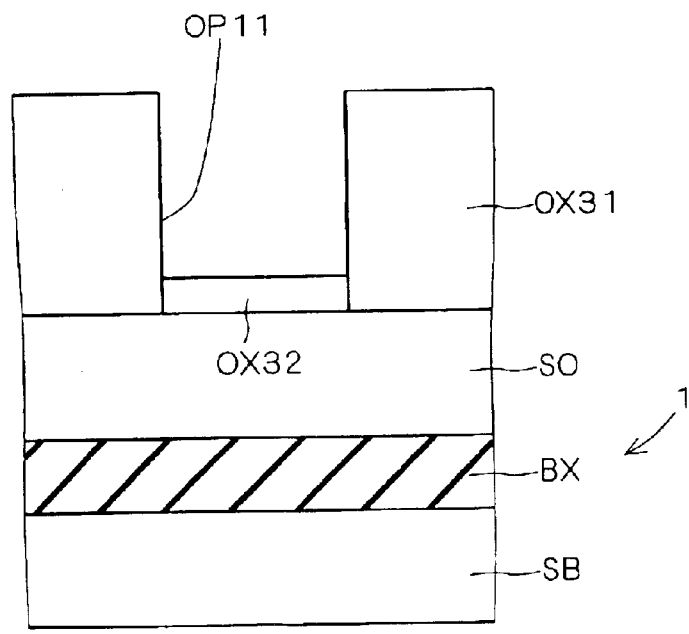

Referring now to FIG. 21, an SOI substrate 1 configured by a silicon substrate SB, buried oxide film BX, and SOI layer SO is prepared. Then, a silicon oxide film OX31 having a thickness of 50 to 300 nm is formed on the entire surface of a main surface of the SOI layer SO.

A resist mask RM31 is patterned on the silicon oxide film OX31. Then, by anisotropic dry etching using the resist mask RM31 as an etching mask, the silicon oxide film OX31 is removed to form an opening OP11 that reaches the SOI layer SO.

The resist mask RM31 is then removed. In the step shown in FIG. 22, a silicon oxide film OX32 having a thickness of 5 to 30 nm is formed on the SOI layer SO that is exposed to the bottom part of the opening OP 11, by for example thermal oxidation method.

Figure 23:
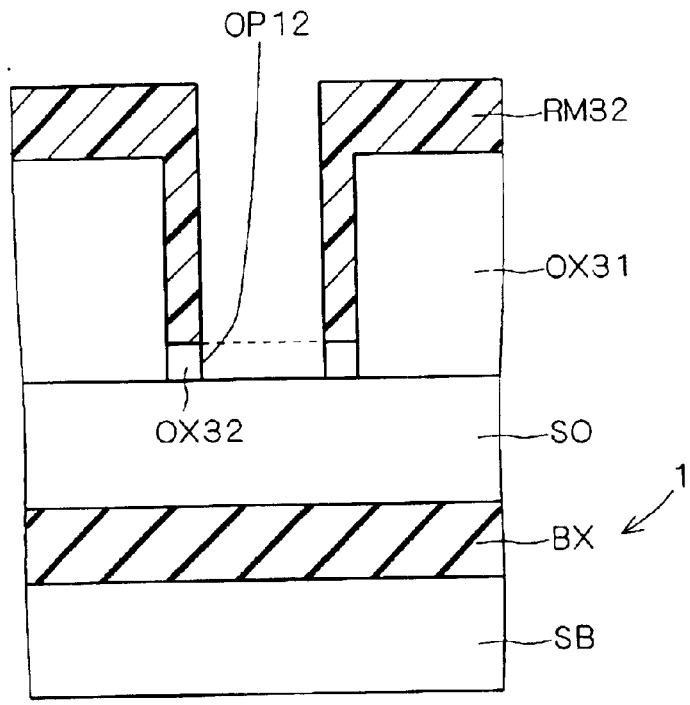

In the step shown in FIG. 23, a resist mask RM32 is patterned so as to cover only the edge portion of the silicon oxide film OX32. By anisotropic dry etching using the resist mask RM32 as an etching mask, the silicon oxide film OX32 is selectively removed to form an opening OP12 that reaches the SOI layer SO.

The resist mask RM32 is then removed. In the step shown in FIG. 24, a resist mask RM33 is formed so as to cover only an upper main surface of the silicon oxide film OX31. Anisotropic dry etching through the opening OP11 is performed to change the opening OP12 of the silicon oxide film OX32 into an opening OP13, the inner wall of which is curved such that its opening area increases as it is vertically away from the SOI layer SO. As the result, the silicon oxide film OX32 becomes a smile oxide film 33 (a second part of a gate insulating film) which has a contour curved so as to project outwardly. The smile oxide film 33 can also be referred to as a "circular smile oxide film" because its curvature could be approximately the same as circle.

The relationship between width X and height Y of the smile oxide film 33 is defined by the impurity concentration of the source/drain layer underlying the smile oxidation structure. That is, as previously described in the first preferred embodiment, the impurity concentration of the source/drain layer below the smile oxidation structure, i.e., the region around point C shown in FIG. 30, is preferably in the range of $1\times10^{19}$ cm$^{-3}$±40% in order that gate overlap capacitance is reduced without decreasing driving current.

Figure 24:
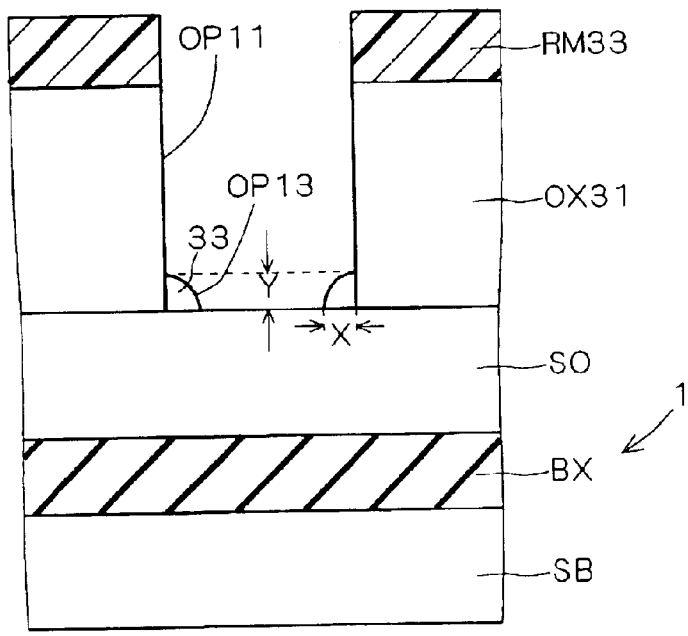

Meanwhile, the opening OP13 is obtainable by setting the etching conditions such that the etching rate of dry etching for forming the opening OP13 is smaller than that for forming the opening OP12, and stopping the etching at the time that the curved inner wall as shown in FIG. 24 is obtained by removing more amount of the upper part of the inner wall of the opening 12 than the lower part.

Figure 25:
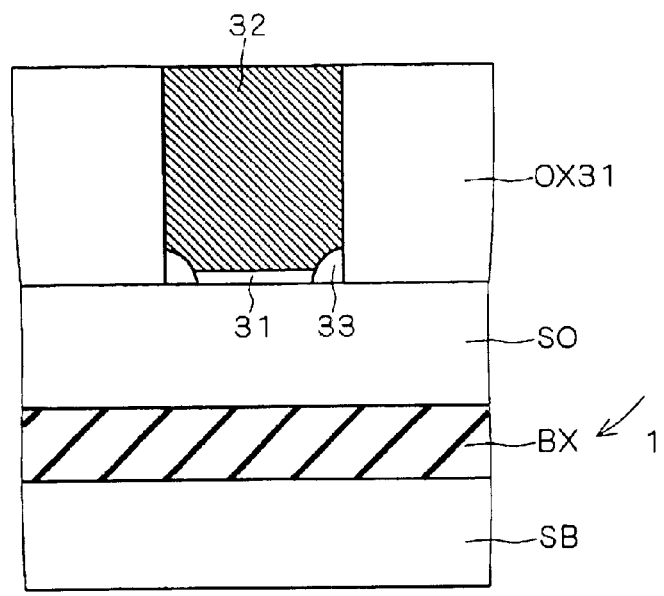

In the step shown in FIG. 25, a gate oxide film OX31 (a first part of the gate insulating film) having a thickness of 1 to 4 nm is formed on the SOI layer SO that is exposed to the bottom part of the opening OP13, by for example thermal oxidation, radical oxidation, radical nitriding method or a combination of these. As the result, the gate oxide film 31 engages the smile oxide film 33. Instead of the silicon oxide film, a silicon nitride film may be used to form the gate insulating film.

Subsequently, a metal gate electrode 32 is obtained by filling the openings OP11 and OP13 with a metal film of aluminum, tungsten or complete silicide gate etc. At this time, the metal film that exists in the outside of the opening OP11 and the metal film deposited on the silicon oxide film OX31 are to be removed by polishing with CMP (chemical mechanical polishing) method.

Figure 26:
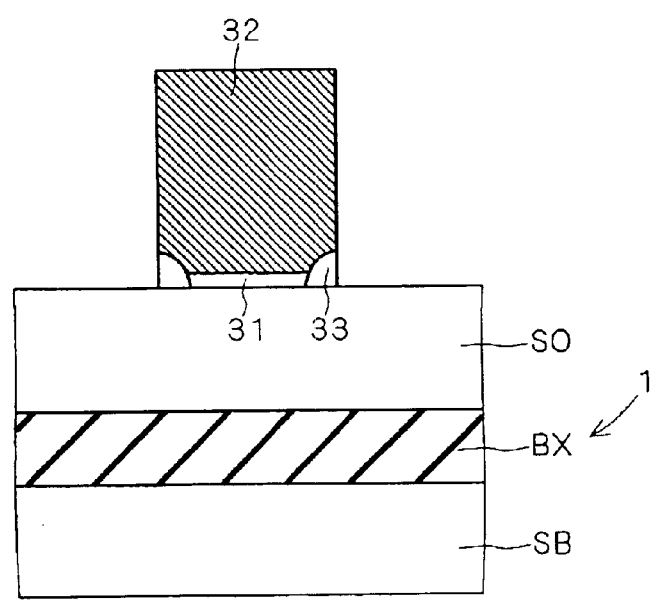

In the step shown in FIG. 26, the silicon oxide film OX31 is then removed to obtain a gate structure that the gate oxide film 31 and metal gate electrode 32 are stacked on the SOI substrate 1. It can be said that the above-mentioned gate structure has a smile oxidation structure because the smile oxide film 33 engages the edge portion of the gate oxide film 31.

Figure 27:
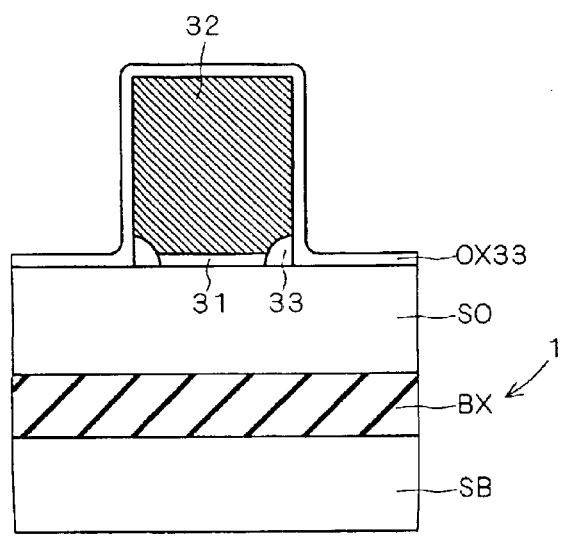

In the step shown in FIG. 27, a HTO film OX33 having a thickness of 5 to 25 nm is deposited on the side surface and upper surface of the gate electrode 32 by using high-temperature CVD method in a $SiH_4$ and $N_2O$ gas or NO gas atmosphere and under the temperature conditions of 700 to 900° C. The HTO film OX33 is also deposited on the main surface of the SOI layer SO.

Figure 28:
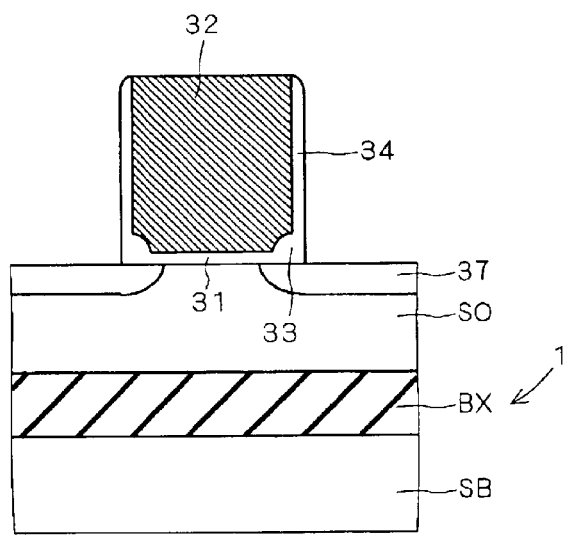

In the step shown in FIG. 28, the HTO film OX33 on the upper surface of the gate electrode 32 and on the main surface of the SOI layer SO are removed by anisotropic dry etching, thereby forming an offset spacer 34 on the side surface of the gate electrode 32.

After forming the offset spacer 34, ion implantation of impurity is performed to form a source/drain extension layer 37. At this time, the impurity concentration of the surroundings of point C shown in FIG. 30 in the source/drain extension layer 37 is set to the range of $1\times10^{19}$ $cm^{-3}\pm40\%$, as previously described.

Figure 29:
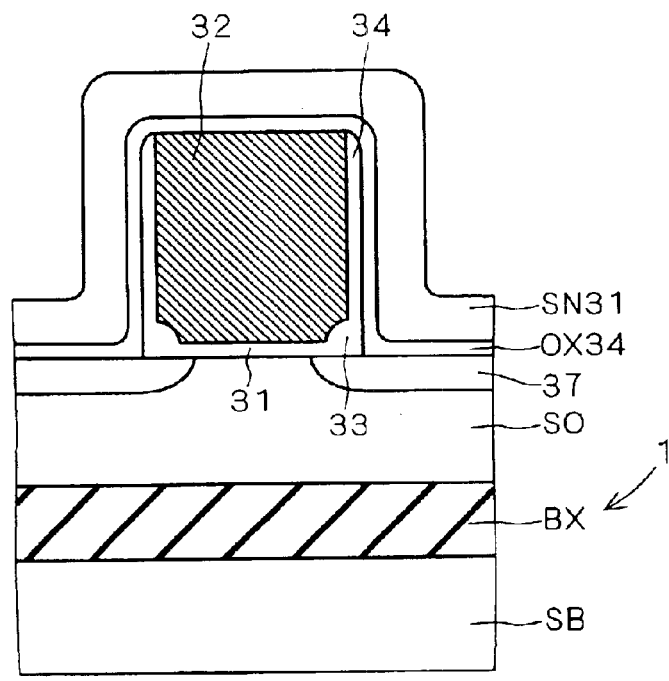
Figure 30:
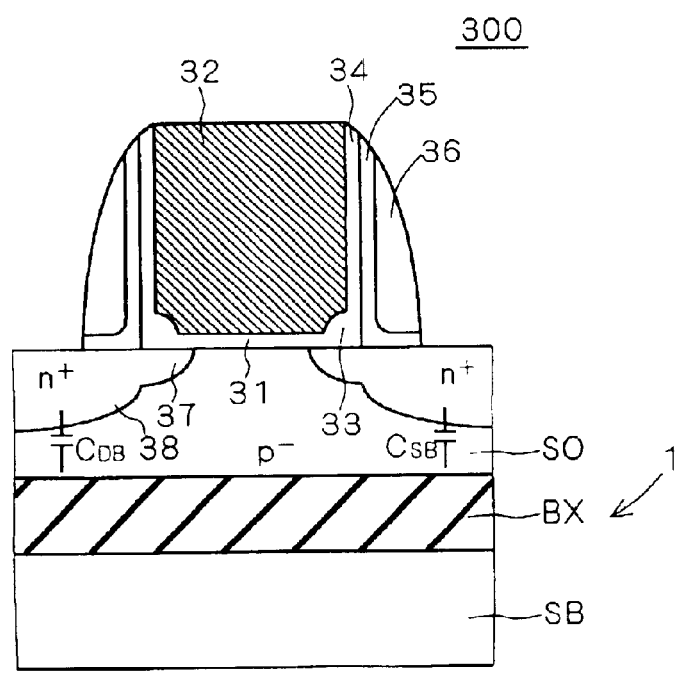

In the step shown in FIG. 29, a TEOS oxide film OX34 having a thickness of 5 to 25 nm is deposited over the entire surface of the SOI substrate 1 by plasma CVD method. Subsequently, a silicon nitride film SN31 having a thickness of 20 to 70 nm is deposited on the TEOS oxide film OX34 by low pressure CVD method or plasma CVD method.

In the step shown in FIG. 30, the TEOS oxide film OX34 and silicon nitride film SN31 on the upper surface of the gate electrode 32 are removed by anisotropic dry etching. This results in such a configuration that has a first gate sidewall 35 located externally of the offset spacer 34 and a second gate sidewall 36 located externally of the first gate sidewall 35.

Subsequently, by using as mask the gate electrode 32, offset spacer 34, and first and second gate sidewalls 35 and 36, ion implantation of impurity is performed to form a source/drain layer 38, thereby obtaining the MOS transistor 300. In FIG. 30, the MOS transistor 300 is illustrated as an N-channel MOS transistor.

Figure 31:
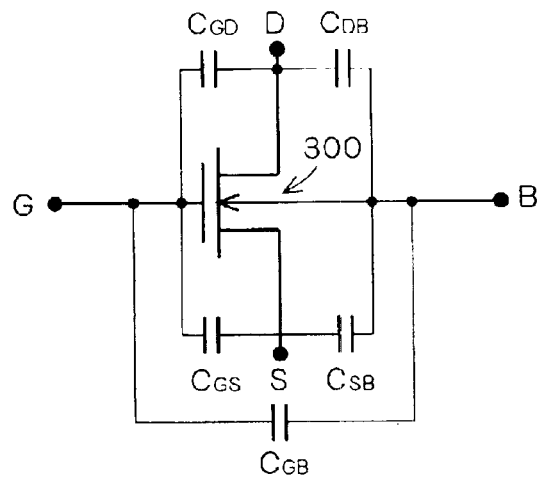
FIG. 31 is a diagram to explain the parasitic capacitance of an MOS transistor.

FIG. 31 shows an equivalent circuit of the parasitic capacitance of the MOS transistor 300. Referring to FIG. 31, in the MOS transistor 300, capacitance $C_{SB}$ between source and substrate, and capacitance $C_{DB}$ between drain and substrate are present as junction capacitance, as well as capacitance $C_{GS}$ between gate and source, and capacitance $C_{GD}$ between gate and drain are present as gate overlap capacitance.

Compared to a bulk device in which an MOS transistor is formed on a bulk silicon substrate, an SOI device in which an MOS transistor is formed on an SOI substrate has a relatively high rate of gate overlap capacitance to junction capacitance. Therefore, in order to improve the operation speed of transistors, a reduction in gate overlap capacitance becomes an extremely important subject.

In consideration of this subject, it can be said that the smile oxidation structure and double-angle smile oxidation structure are of highly advantageous to SOI devices.

<C-2. Operation and Effect>

As described above, the MOS transistor 300 of the third preferred embodiment is directed to the case that the metal gate electrode has the smile oxidation structure. Also in this case, gate overlap capacitance can be reduced without decreasing driving current by setting the impurity concentration of the source/drain layer below the smile oxidation structure, i.e., the region around point C shown in FIG. 30 (the region immediately below the edge portion of the smile oxide film 33) to the range of $1\times10^{19}$ $cm^{-3}\pm40\%$.

According to the manufacturing method of the third preferred embodiment, length X and height Y of the smile oxide film 33 can be set arbitrarily. This is advantageous for obtaining the structure capable of reducing gate overlap capacitance without decreasing driving current. This also facilitates formation of MOS transistors to meet the user's demand.

In addition, after forming the smile oxide film 33 in the step shown in FIG. 24, the metal gate electrode 32 is obtained by filling the opening OP11 with the metal film as shown in FIG. 25. Compared to the method in which a metal gate electrode is obtained by forming a metal film by etching, the degree of freedom for selecting a gate electrode material is improved to permit application to a wide variety of metal gate electrodes. It is of course possible to use a polysilicon film in place of the metal film.

In the metal gate electrode, no depletion occurs within the gate electrode, thus increasing the accumulate effect of impurities below the gate edge. Further, the gate resistance can be lowered. Therefore, maximum oscillation frequency (fmax) can be increased effectively when gate overlap capacity is lowered.

In addition, after forming the smile oxide film 33, the offset spacer 34 is formed independently in the step shown in FIG. 28. Therefore, the length of the smile oxide film 33 and the width of the offset spacer 34 can be set separately. This increases the degree of freedom for setting the length of the smile oxide film 33 and the width of the offset spacer 34 and thus facilitates formation of MOS transistors to meet the user's demand.

Although the foregoing description is made of the example that the MOS transistor 300 is formed on the SOI substrate, it may be formed on a bulk silicon substrate.

<C-3. Modification 1>

The above-mentioned MOS transistor 300 includes the smile oxide film 33 having such a contour curved so as to project outwardly. According to the manufacturing method of the third preferred embodiment, it is also possible to obtain an MOS transistor 300A including a smile oxide film having a contour curved so as to concave inwardly, as shown in FIG. 32.

Figure 32:
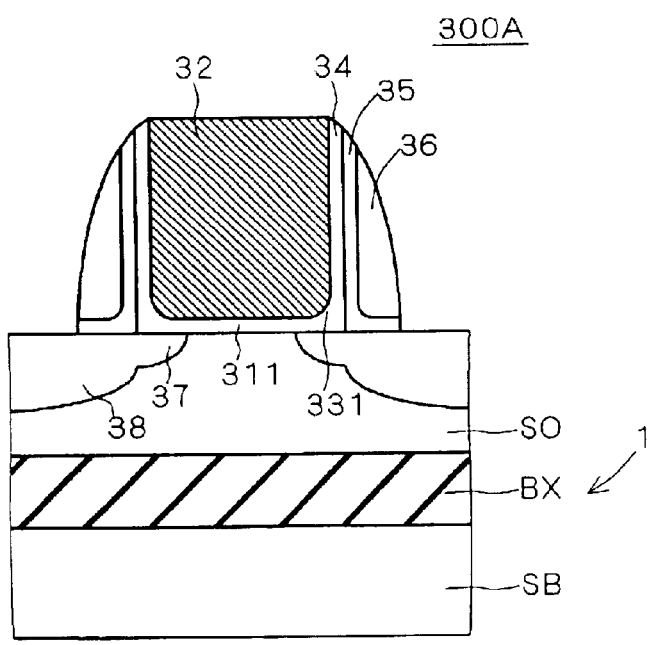
FIG. 32 is a sectional view to explain the configuration of one modification in the semiconductor device of the third preferred embodiment.

Referring to FIG. 32, the MOS transistor 300A has such a smile oxidation structure that a smile oxide film 331 being thicker than a gate oxide film 311 and having a contour curved so as to concave inwardly is engaged with the edge portion of the gate oxide film 311.

Like components are identified by the same reference numerals as in the MOS transistor 300 of FIG. 30, and their description is omitted here.

Figure 33:
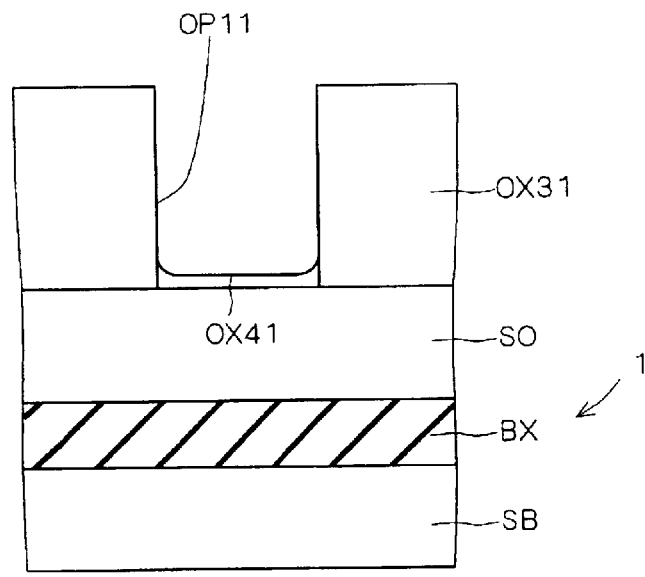
FIGS. 33 and 34 are sectional views to explain the manufacturing steps of the modification of the third preferred embodiment.

In order to obtain this structure, after passing through the step shown in FIG. 21, an opening is formed in the silicon oxide film OX31. Thereafter, the step shown in FIG. 33 is employed instead of the step of FIG. 22, so that a silicon oxide film OX41 having a thickness of 1 to 10 nm is formed by CVD method on the SOI layer SO exposed to the bottom part of the opening OP11. As the result, the edge portion of the opening is thickened.

Subsequently, a metal gate electrode 32 is obtained by filling the opening OP11 with a metal film of aluminum etc. The same steps as shown in FIGS. 26 to 29 are performed to obtain the MOS transistor 300A.

Figure 34:
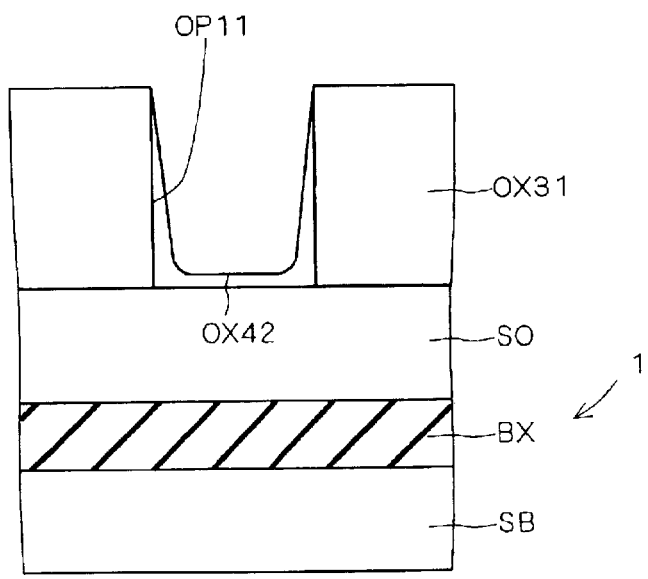

FIG. 33 illustrates the case that the silicon oxide film OX41 is formed only on the bottom part of the opening OP11. In an alternative, depending on the conditions of CVD, the silicon oxide film could be formed on the sidewall of the opening OP11, and the silicon oxide film OX42 could be formed so as to cover the bottom part and sidewall of the opening OP11, as shown in FIG. 34.

In this case, there is the merit that the step of forming an offset spacer can be omitted by using the silicon oxide film on the sidewall as the offset spacer.

Although the second preferred embodiment is directed to the double-angle smile oxide film of two-stage taper, the smile oxide film is not limited to the double-angle one. In fact, it may be of triple or more angles. Smile oxide films that have triple or more angles for forming a plurality of tapers are referred to as "multiple smile oxide films." It can also be said that a circular smile oxide film is a smile oxide film of an ultimate polygon.

<C-4. Modification 2>

As previously described, the smile oxidation structure and double-angle smile oxidation structure are highly advantageous to SOI devices. In an ultra-thin SOI device in which the thickness of an SOI layer is especially decreased, an elevated source/drain structure is used in some cases in order to reduce parasitic source/drain series resistance.

Figure 35:
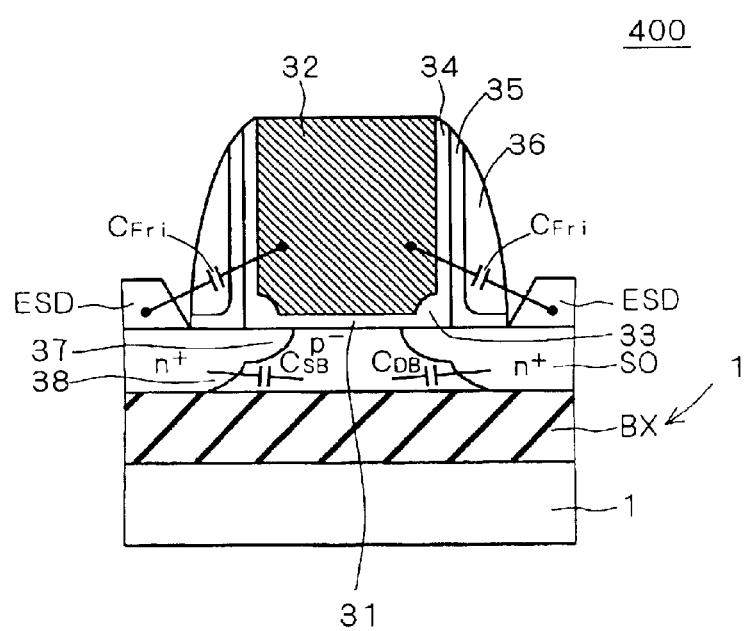
FIG. 35 is a sectional view to explain the configuration of other modification in the semiconductor device of the third preferred embodiment.

FIG. 35 shows a sectional configuration of an MOS transistor 400 having an elevated source/drain ESD. Like components are identified by the same reference numerals as in the MOS transistor 300 of FIG. 30, and their description is omitted here.

Referring to FIG. 35, the elevated source/drain ESD is obtained by growing an epitaxial silicon film so as to be elevated on the source/drain layer 38. The elevated source/drain ESD contains the same impurity as the source/drain layer.

In case of employing the elevated source/drain structure, capacitance $C_{fri}$ between gate and elevated source/drain is remarkably increased, whereas there is the effect that an increase in capacitance $C_{fri}$ between gate and elevated source/drain can be suppressed by using the smile oxidation structure or double-angle smile oxidation structure in an MOS transistor in order to increase the distance between the gate and elevated source/drain.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device including an MOS transistor comprising:
    a semiconductor substrate;
    a gate insulating film selectively disposed on said semiconductor substrate;
    a gate electrode selectively disposed on said gate insulating film; and
    a spacer insulating film disposed on a side surface of said gate electrode,
    wherein said gate insulating film includes a first part corresponding to a central portion of a lower part of said gate electrode and a second part corresponding to an edge portion of the lower part of said gate electrode,
    said second part has a contoured shape widening vertically so as to increase its thickness from a portion for engagement with said first part,
    a contoured shape in a state that said spacer insulating film engages said second part of said gate insulating film is in a continuous form of at least an inclination having a first angle corresponding to a tilt angle of a side lower part of said gate electrode and an inclination having a second angle with respect to a main surface of said semiconductor substrate on an upper side of said second part of said gate insulating film,
    said first angle is greater than said second angle, and
    the side surface of said gate electrode has a contoured shape curved in a continuous form such that an upper main surface of said gate electrode is wider than a lower main surface.

2. The semiconductor device according to claim 1, wherein
    said first angle is in a range of 86°±5%, and
    said second angle is in a range of 10°±70%.

3. The semiconductor device according to claim 1 wherein
    said MOS transistor has a source/drain layer extending to an underside of said second part of said gate insulating film, and
    an impurity concentration of said source/drain layer is in a range of $4 \times 10^{18}$ cm$^{-3}$±40%.

4. The semiconductor device according to claim 3 wherein
    said MOS transistor further includes an elevated source/drain electrode disposed above a portion of said source/drain layer which extends into a main surface of said semiconductor substrate located externally of the side surface of said gate electrode.

5. A semiconductor device including an MOS transistor comprising:
    a semiconductor substrate;
    a gate insulating film selectively disposed on said semiconductor substrate;
    a gate electrode selectively disposed on said gate insulating film; and
    a spacer insulating film disposed on a side surface of said gate electrode,
    wherein said gate insulating film includes a first part corresponding to a central portion of a lower part of said gate electrode and a second part corresponding to an edge portion of the lower part of said gate electrode,
    said second part has a contoured shape widening upwardly so as to increase its thickness from a portion for engagement with said first part and also curving so as to project outwardly.

6. The semiconductor device according to claim 5, wherein
    said second part of said gate insulating film includes a curvature of approximately a circle.

7. The semiconductor device according to claim 5 wherein
    said MOS transistor has a source/drain layer extending to an underside of said second part of said gate insulating film, and
    an impurity concentration of said source/drain layer is in a range of $1 \times 10^{19}$ cm$^{-3}$±40%.

8. The semiconductor device according to claim 7 wherein
    said MOS transistor further includes an elevated source/drain electrode disposed above a portion of said source/drain layer which extends into a main surface of said semiconductor substrate located externally of the side surface of said gate electrode.

9. The semiconductor device according to claim 5, wherein
    said gate electrode is a metal gate.

* * * * *